United States Patent
Chang et al.

(10) Patent No.: US 12,289,089 B2
(45) Date of Patent: Apr. 29, 2025

(54) ACOUSTIC WAVE DEVICE WITH ENHANCED QUALITY FACTOR AND FABRICATION METHOD THEREOF

(71) Applicant: RichWave Technology Corp., Taipei (TW)

(72) Inventors: Chin-Chia Chang, Taipei (TW); Shih-Meng Lin, Taipei (TW); Shih-Che Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 286 days.

(21) Appl. No.: 17/849,698

(22) Filed: Jun. 26, 2022

(65) Prior Publication Data
US 2023/0327629 A1    Oct. 12, 2023

(30) Foreign Application Priority Data
Apr. 7, 2022 (TW) .................................. 111113179

(51) Int. Cl.
*H03H 3/08* (2006.01)
*H03H 9/02* (2006.01)
*H03H 9/145* (2006.01)

(52) U.S. Cl.
CPC .......... *H03H 3/08* (2013.01); *H03H 9/02992* (2013.01); *H03H 9/14547* (2013.01)

(58) Field of Classification Search
CPC ... H03H 9/02992; H03H 9/14547; H03H 3/08
See application file for complete search history.

(56) References Cited

U.S. PATENT DOCUMENTS

| | | | |
|---|---|---|---|
| 4,044,321 A * | 8/1977 | Vasile | H03H 9/1452 333/194 |
| 8,552,618 B2 * | 10/2013 | Okumichi | H03H 9/1457 310/313 R |
| 2013/0051588 A1 | 2/2013 | Ruile | |
| 2017/0338796 A1 | 11/2017 | Morimoto | |

(Continued)

FOREIGN PATENT DOCUMENTS

| CN | 111294009 A | 6/2020 |
|---|---|---|
| KR | 10-2016-0114199 A | 10/2016 |

OTHER PUBLICATIONS

Office action mailed on Sep. 7, 2023 for the Taiwan application No. 111113179, filing date Apr. 7, 2022, p. 1-8. ,Sep. 7, 2023.

(Continued)

*Primary Examiner* — Andrea Lindgren Baltzell
*Assistant Examiner* — Abigail Amir Yaldo
(74) *Attorney, Agent, or Firm* — Winston Hsu

(57) ABSTRACT

An acoustic wave device includes a piezoelectric substrate and a transducer. The piezoelectric substrate has a surface. The transducer is disposed on the surface. The transducer includes a first electrode, a second electrode, and at least one protrusion. The first electrode extends along a first direction and has a first end. The second electrode extends along the first direction and has a second end. The first electrode and the second electrode are spaced apart from each other along a second direction. The at least one protrusion is disposed at the first end of the first electrode. The at least one protrusion extends along the first direction and partially obstruct the first end.

20 Claims, 5 Drawing Sheets

(56) References Cited

U.S. PATENT DOCUMENTS

2020/0091892 A1    3/2020   Watanabe
2021/0067136 A1    3/2021   Fujiwara
2021/0159886 A1    5/2021   Goto

OTHER PUBLICATIONS

Office Action mailed on Aug. 29, 2024 for the Korean Application No. 10-2023-0045661, filing date Apr. 6, 2023, pp. 1-5.

* cited by examiner

ACOUSTIC WAVE DEVICE WITH ENHANCED QUALITY FACTOR AND FABRICATION METHOD THEREOF

TECHNICAL FIELD

The present invention relates to radio frequency communication, and in particular, to an acoustic wave device with enhanced quality factor in radio frequency communication and a fabrication method thereof.

BACKGROUND

An acoustic wave device, such as a surface acoustic wave (SAW) device, may be used for the conversion and transmission of electrical and acoustic signals. The acoustic wave devices are used in many applications. For example, the acoustic wave devices can serve as filters to filter out noise and keep wireless signals in the desired frequency bands, offering a low transmission loss and excellent performance in anti-electromagnetic interference and being compact in size, and thus providing wide uses in various communication products. The acoustic wave devices may also serve as resonators. Nevertheless, conventional acoustic wave devices may suffer from energy leakage owing to manufacturing errors, resulting in degradation in quality factor.

SUMMARY

According to an embodiment of the invention, an acoustic wave device includes a piezoelectric substrate and a transducer. The piezoelectric substrate has a surface. The transducer is disposed on the surface of the piezoelectric substrate, and includes a first electrode, a second electrode, and at least one first protrusion. The first electrode extends along a first direction and having a first end. The second electrode extends along the first direction and having a second end. The second electrode and the first electrode are spaced apart along a second direction. The at least one first protrusion is disposed at the first end of the first electrode, extends along the first direction and partially obstructs the first end.

According to another embodiment of the invention, a method of fabricating an acoustic wave device is provided. The method includes providing a piezoelectric substrate having a surface, forming a conductive layer on the surface, and patterning the conductive layer with a photomask to form a patterned conductive layer. The step of forming the patterned conductive layer includes forming a first electrode along a first direction, the first electrode having a first end. At least one first protrusion is formed at the first end of the first electrode, the at least one first protrusion extends along the first direction and partially obstructs the first end. A second electrode is formed along the first direction, and the second electrode has a second end. The second electrode and the first electrode are spaced apart along a second direction.

DETAILED DESCRIPTION

Figure 1:
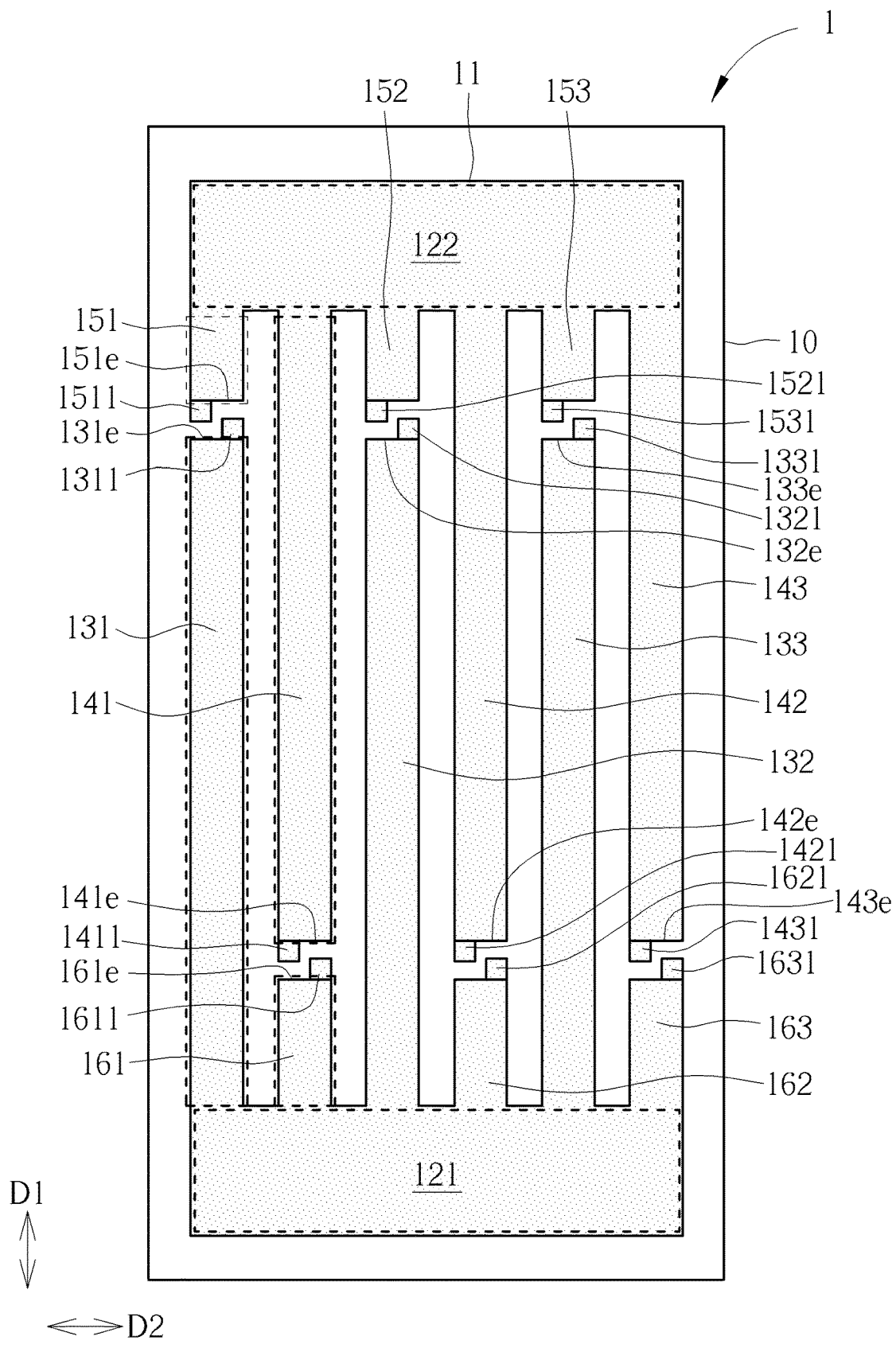
FIG. 1 is a top view of an acoustic wave device according to an embodiment of the invention.

Below, exemplary embodiments will be described in detail with reference to accompanying drawings so as to be easily realized by a person having ordinary knowledge in the art. The inventive concept may be embodied in various forms without being limited to the embodiments set forth herein. Descriptions of well-known parts are omitted for clarity, and like reference numerals refer to like elements throughout.

FIG. 1 is a top view of an acoustic wave device such as a surface acoustic wave (SAW) device according to an embodiment of the invention. In some embodiments, the SAW device 1 may be used in a radio frequency (RF) front-end circuit to receive an RF signal and filter the RF signal to generate a filtered signal. For example, the SAW device 1 may receive an RF signal transmitted from an antenna, filter the RF signal to generate a filtered signal, and output the filtered signal to a receiver. The applications of the SAW device 1 are not limited to the given example, and may further be used in other applications.

The SAW device 1 may include a piezoelectric substrate 10 and a transducer 11. The piezoelectric substrate 10 may include a substrate and a piezoelectric material layer disposed on the substrate. For example, the substrate of the piezoelectric substrate may include a silicon substrate. The piezoelectric material layer may include piezoelectric single crystals, piezoelectric polycrystals (including piezoceramics), piezoelectric polymers, and piezoelectric composite materials. The piezoelectric material layer may include, e.g., zinc oxide (ZnO), aluminum nitride (AlN), lithium tantalate (LiTaO3), and any combination thereof. The transducer 11 may include a metallic material, and the metallic material may include molybdenum (Mo), copper (Cu), aluminum (Al), gold (Au), platinum (Pt), tungsten (W) and any combination thereof.

In some embodiments, the transducer 11 may be disposed on the surface of the piezoelectric substrate 10 and include at least a pair of interdigital structures not directly connected to each other and having a gap therebetween. For example, the pair of interdigital structures may include a first set of interdigital structures and a second set of interdigital structures. As shown in FIG. 1, the first set of interdigital structures may include a bus bar 121, electrodes 131 to 133, and dummy electrodes 161 to 163, and the second set of interdigital structures may include a bus bar 122, electrodes 141 to 143, and dummy electrodes 151 to 153.

In the embodiment, the electrodes 131 to 133 and the electrodes 141 to 143 extend along the direction D1, and the bus bars 121 and 122 extend along the direction D2. In some embodiments, the electrodes 131 to 133 may serve as fingers of the first set of interdigital structures, and the electrodes 141 to 143 may serve as fingers of the second set of interdigital structures. The first set of interdigital structures and the second set of interdigital structures are arranged interdigitally. The adjacent fingers (i.e., electrodes) are arranged at intervals along the direction D2, that is, there are gaps between adjacent fingers. For example, the electrodes 131, 141, 132, 142, 133, and 143 may be sequentially arranged at intervals along the direction D2. Further, the electrodes 131 to 133 may extend from the bus bar 121 in the direction D1, respectively, and the electrodes 141 to 143 may extend from the bus bar 122 in the direction D1, respectively. In this embodiment, for example, the electrodes 131 and 141 may respectively have ends 131e and 141e, and other electrodes 132, 142, 133 and 143 may also respectively have ends (unmarked in figures). In the embodiment, the direction D2 may be, but is not limited to, perpendicular to the direction D1. In other embodiments, the direction D2 and the direction D1 may form an angle other than 90 degrees. In the embodiment, the direction D1 and the direction D2 are both parallel to the surface of the piezoelectric substrate 10.

In some embodiments, the dummy electrodes 151 to 153 may extend from the bus bar 122 along the direction D1, respectively, and may be aligned with the electrodes 131 to 133, respectively. The dummy electrodes 161 to 163 may extend from the bus bar 121 along the direction D1, respectively, and may be aligned with the electrodes 141 to 143, respectively. In the embodiment, the dummy electrodes 151 and 161 may respectively have dummy ends 151e and 161e, and other dummy electrodes 152, 162, 153 and 163 may respectively have dummy ends (unmarked in figures). Specifically, the electrode 131 may be aligned with the dummy electrode 151 and a gap may be formed therebetween. In other words, the end 131e of the electrode 131 may be aligned with the dummy end 151e of the dummy electrode 151 with a gap formed between the end 131e and the dummy end 151e. With respect to the electrode 141 and the dummy electrode 161, the electrode 132 and the dummy electrode 152, the electrode 142 and the dummy electrode 162, the electrode 133 and the dummy electrode 153, and/or the electrode 143 and the dummy electrode 163, gaps may be formed therebetween respectively, which may be similar to electrode 131 and dummy electrode 151, and the explanation may therefore be omitted here for brevity.

In the embodiment, the dummy electrodes 151 to 153 and/or the dummy electrodes 161 to 163 are provided to reduce the leakage of the acoustic waves, specifically, leakage along the direction D1. However, the present invention is not limited to the embodiment in FIG. 1. In other embodiments, the dummy electrodes 151 to 153 and/or the dummy electrodes 161 to 163 may be omitted. In such an embodiment, gaps are formed between the end of the electrode 131 and the bus bar 122, between the end of electrode 132 and the bus bar 122, and/or between the end of electrode 133 and the bus bar 122, respectively. Similarly, gaps are formed between ends of the electrodes 141 to 143 and the bus bar 121, respectively.

In some embodiments, the transducer 11 may function as an input transducer or an output transducer. Taking the input transducer as an example, an electrical signal may be input into the bus bar 121/122, and may be converted into an acoustic signal by the piezoelectric substrate 10 and the electrodes 131, 141, 132, 142, 133, and 143 thereon. The acoustic signal may propagate along the direction D2. In other embodiments, the transducer 11 may also be used as an output transducer for converting an acoustic signal into an electrical signal. An imaginary line connecting the aligned ends 131e to 133e along the direction D2 and another imaginary line connecting the aligned ends 141e to 143e along the direction D2 may be used to define an effective transmission area for the acoustic signal. Specifically, taking directions shown in FIG. 1 as example, the imaginary line connecting ends 131e, 132e, and 133e may be defined as an upper boundary of the effective transmission area for the acoustic signal, and the imaginary line connecting ends 141e, 142e, and 143e may be defined as a lower boundary.

In some embodiments, the SAW device 1 may operate in a piston mode, and energy may not leak or may leak insignificantly through, for example, gaps between electrodes 131 to 133 and corresponding dummy electrodes 151 to 153 and/or gaps between electrodes 141 to 143 and corresponding dummy electrodes 161 to 163. According to experiments, when the gap, such as the one between the electrode 131 and the dummy electrode 151 and/or the one between the electrode 141 and the dummy electrode 161, is narrower, energy leakage of the acoustic signal along the direction D1 may be less. As a result, the SAW device 1 may have an enhanced quality factor (Q factor). In order to obtain a narrower gap, the end of each electrode and/or the dummy end of each dummy electrode may be corrected by means of optical proximity correction (OPC). For example, as for the ends of the electrodes 131 to 133 and/or the dummy ends of the dummy electrodes 151 to 153, their shapes may be modified to be close to rectangles (e.g., shapes with right angles) by means of OPC. Similarly, ends of the electrodes 141 to 143 and/or dummy ends of the dummy electrodes 161 to 163 may also be modified in shape to be close to rectangles. With the shape modifications, the distance between an electrode and its corresponding dummy electrode may be optimized or reduced. Alternatively, in the case of no dummy electrodes provided, the distance between the electrodes and the bus bar may be optimized or reduced. For example, in the case of dummy electrodes provided, the distance between the electrode 131 and the dummy electrode 151 may be reduced, and/or the distance between the electrode 141 and the dummy electrode 161 may be reduced. In the OPC method, a photomask may be used to pattern a layer, and the photomask may include a pattern mask portion and at least one additional mask portions. The additional mask portions may be added at the corners, ends, and/or edges of the pattern mask portion, so as to compensate for pattern errors resulting from light diffraction and/or other process effects. The shape of the additional mask portions may be polygons, and will be explained in the following paragraphs.

In some embodiments, in the OPC method, a protrusion 1311 may be formed at the end 131e of the electrode 131, and/or a dummy protrusion 1511 may be formed at the dummy end 151e of the dummy electrode 151. Further, a protrusion 1411 may be formed at the end 141e of the electrode 141, and/or a dummy protrusion 1611 may be formed at the dummy end 161e of the dummy electrode 161. Similarly, protrusions 1321-1331 and 1421-1431 may be formed at the ends of the electrodes 132-133 and 142-143, respectively, and/or dummy protrusions 1521-1531 and 1621-1631 may be formed at the ends of the dummy electrodes 152-153 and 162-163, respectively.

In some embodiments, the electrode 131 may extend from the bus bar 121 to the end 131e along the direction D1. The protrusion 1311 may be disposed at the end 131e of the electrode 131 and may extend from the end 131e along the direction D1. In FIG. 1, the protrusion 1311 may partially obstruct the end 131e. The dummy protrusion 1511 may be disposed at the dummy end 151e of the dummy electrode 151, and may extend from the dummy end 151e along the direction D1. The dummy protrusion 1511 may partially obstruct the dummy end 151e. A gap formed between the end 131e and the dummy end 151e may be defined as a first gap, and the protrusion 1311 and the dummy protrusion 1511 may be disposed in the first gap. In some embodiments, the protrusion 1311 and the dummy protrusion 1511 may be spaced apart along the direction D2. For example, the protrusion 1311 and the dummy protrusion 1511 may be arranged alternately and sequentially along the direction D2. Similarly, the electrode 141 may extend from the bus bar 122 to the end 141e along the direction D1. The protrusion 1411 may be disposed at the end 141e of the electrode 141 and may extend from the end 141e along the direction D1. The protrusion 1411 may partially obstruct the end 141e. The dummy protrusion 1611 may be disposed at the dummy end 161e of the dummy electrode 161, and may extend from the dummy end 161e along the direction D1. The dummy protrusion 1611 may partially obstruct the dummy end 161e. The gap formed between the end 141e and the dummy end 161e may be defined as a second gap, and the protrusion 1411 and the dummy protrusion 1611 may be disposed in the second gap. In some embodiments, the protrusion 1411 and the dummy protrusion 1611 may be spaced apart along the direction D2. For example, the protrusion 1411 and the dummy protrusion 1611 may be arranged alternately and sequentially along the direction D2.

In FIG. 1, the protrusion 1311 may be, but is not limited to, located at the right of the end 131e of the electrode 131 with respect to the direction D2. In other embodiments, the protrusion 1311 may be located at the left or center of the end 131e of the electrode 131. Similarly, the dummy protrusion 1511 may be located at the right or center of the dummy end 151e of the dummy electrode 151. For example, when the protrusion 1311 is located at the left of the end 131e, the dummy protrusion 1511 may be located at the right of the dummy end 151e. Similarly, the protrusion 1411 may be located at the left, center, or right in relation to the end 141e of the electrode 141, and/or the dummy protrusion 1611 may be located at the left, center, or right in relation to the dummy end 161e of the dummy electrode 161.

In some embodiments, the electrode 131 may be integrated with the protrusion 1311, the electrode 141 may be integrated with the protrusion 1411, the dummy electrode 151 may be integrated with the dummy protrusion 1511, and/or the dummy electrode 161 may be integrated with the dummy protrusion 1611.

In some embodiments, for example, the end 131e of the electrode 131 may have a smooth surface, such as an arced surface, or a flat surface in parallel to the direction D2. For example, a size of the protrusion 1311 along the direction D2 (e.g. the width of the protrusion 1311 along the direction D2) may be 5% to 50% of a size of the end 131e along the direction D2 (e.g. the width of the end 131e along the direction D2), such that the protrusion 1311 partially obstructs the end 131e. A size of the dummy protrusion 1511 along the direction D2 (e.g. the width of the dummy protrusion 1511 along the direction D2) may be 5% to 50% of a size of the dummy end 151e along the direction D2 (e.g. the width of the dummy end 151e along the direction D2), such that the dummy protrusion 1511 partially obstructs the dummy end 151e. In the embodiment, the size of the protrusion 1311 along the direction D2 may be identical with or different from the size of the dummy protrusion 1511 along the direction D2. Similarly, a size of the protrusion 1411 along the direction D2 (e.g. the width) may be 5% to 50% of a size of the end 141e along the direction D2 (e.g. the width). And/or, a size of the dummy protrusion 1611 along the direction D2 (e.g. the width) may be 5% to 50% of a size of the dummy end 161 along the direction D2 (e.g. the width).

By arranging the protrusions and/or the dummy protrusions in the gaps, the energy leakage from the electrodes to the dummy electrodes or from the electrodes to the bus bars may be reduced or eliminated, thereby enhancing the quality factor of the SAW device 1.

While the first set of interdigital structures of the SAW device 1 in FIG. 1 includes 3 electrodes (the electrodes 131, 132, 133) and 3 dummy electrodes (the dummy electrodes 161, 161, 163), and the second set of interdigital structures includes three electrodes (the electrodes 141, 142, 143) and three dummy electrodes (the dummy electrodes 151, 152, 153), those skilled in the art would recognize that the number of electrodes/dummy electrodes in each set of interdigital structure in the SAW device 1 may be varied to meet the requirements of actual applications without deviating from the principle of the invention.

Figure 2:
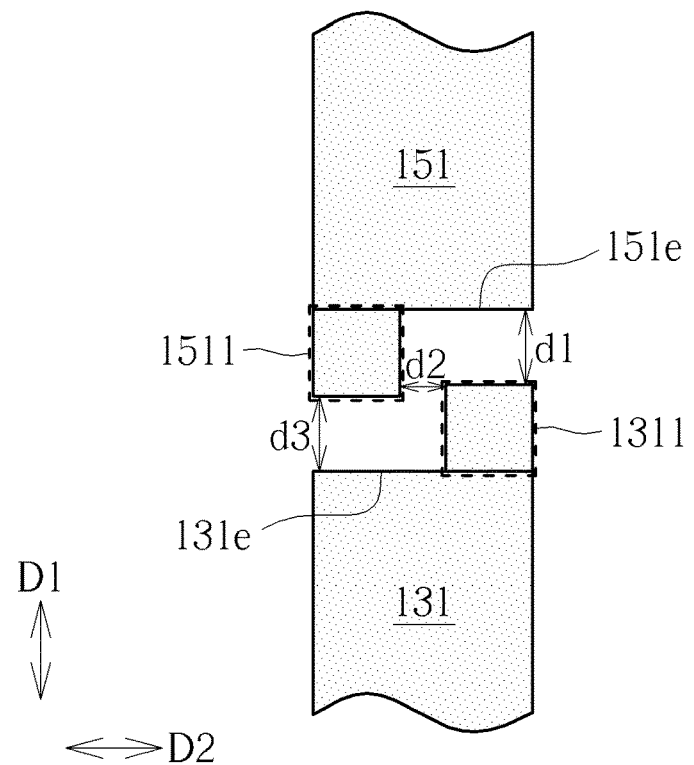
FIG. 2 is a schematic diagram of a transducer of the acoustic wave device in FIG. 1.

FIG. 2 is a schematic diagram of a transducer of the SAW device 1. In FIG. 2, the transducer 11 includes the electrode 131, the protrusion 1311, the dummy electrode 151, and the dummy protrusion 1511. In some embodiments, the distance d1 between the protrusion 1311 and the dummy end 151e in the direction D1 is at least 0.3 μm, the distance d2 between the protrusion 1311 and the dummy protrusion 1511 in the direction D2 is at least 0.3 μm, and/or the distance d3 between the dummy protrusion 1511 and the end 131e in the direction D1 is at least 0.3 μm. In the embodiment, the distances d1, d2, and d3 may be equal or different. Similarly, the configuration of the electrodes 141, the protrusion 1411, the dummy electrodes 161 and the dummy protrusion 1611 may be similar to those in FIG. 2, and description will not be repeated here for brevity.

In FIG. 2, the protrusion 1311 and the dummy protrusion 1511 may be spaced apart along the direction D2, for example, by the distance d2. The protrusion 1311 and the dummy protrusion 1511 may be partially overlapping or non-overlapping viewed along the direction D1. In other words, the orthographic projections of the protrusion 1311 and the dummy protrusion 1511 on a plane parallel to the direction D1 may be partially overlapping or non-overlapping.

Figure 3:
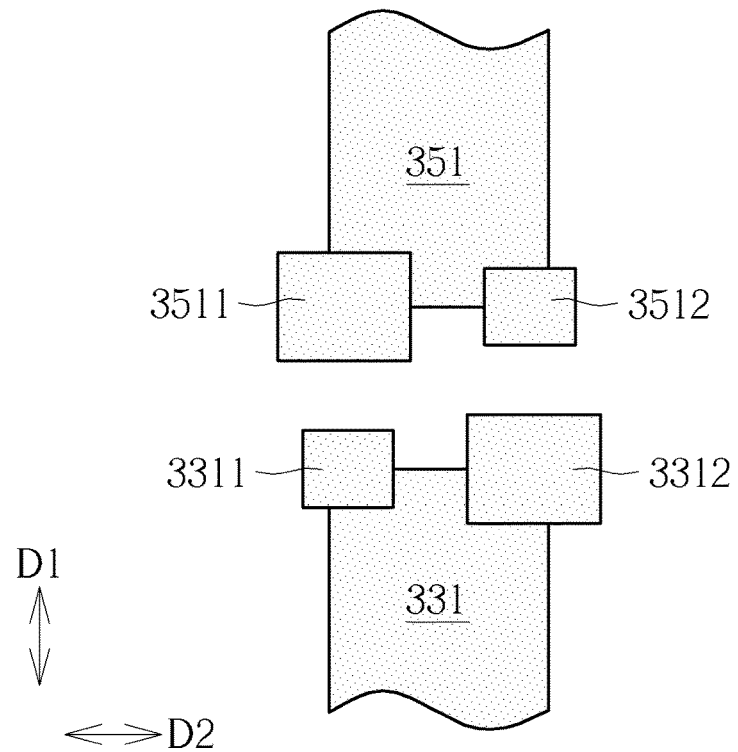
FIG. 3 is a schematic diagram of a photomask used for forming the transducer of the acoustic wave device in FIG. 2.

FIG. 3 is a schematic diagram of a photomask used for forming the transducer of the acoustic wave device 1 in FIG. 2. In FIG. 3, the photomask is an OPC photomask including pattern mask portions 351 and 331 and additional mask portions 3511, 3512, 3311 and 3312. The additional mask portions 3511 and 3512 may be respectively located at corners of the pattern mask portion 351, and the additional mask portions 3311 and 3312 may be respectively located at corners of the pattern mask portion 331. The pattern mask portions 351 and 331 may be used to form the dummy electrode 151 and the electrode 131, respectively. The dummy end 151e of the formed dummy electrode 151 and/or the end 131e of the formed electrode 131 may ideally have right-angled shapes, however, the shapes may be oval, arced, or other irregular shapes resulting from, for example, over-etching at the end. The additional mask portion 3511 may be larger in size than the additional mask portion 3512. With the additional mask portion 3511, the dummy protrusion 1511 may be formed at a corner of the dummy end 151e of the dummy electrode 151. With the additional mask portion 3512, which may have a smaller area, the shape at the other corner of the dummy end 151e of the dummy electrode 151 may be modified so as to be a right-angled corner. Therefore, the additional mask portion 3512 may be used to avoid over-etching at the other corner of the dummy end 151e of the dummy electrode 151. Similarly, the additional mask portion 3312 may be larger in size than the additional mask portion 3311. With the additional mask portion 3312, the protrusion 1311 may be formed at a corner of the end 131e of the electrode 131. With the additional mask portion 3311, which may have a smaller area, the shape at the other corner of the end 131e of the electrode 131 may be modified so as to be a right-angled corner. Therefore, the additional mask portion 3311 may be used to avoid over-etching at the other corner of the end 131e of the electrode 131. In FIG. 3, the additional mask portions 3511, 3512, 3311 and 3312 may be rectangular. The area of the additional mask portion 3511 may be the same as that of the additional mask portion 3312, and/or the area of the additional mask portion 3512 may be the same as that of the additional mask portion 3311. In some embodiments, shapes of the additional mask portions 3511, 3512, 3311 and 3312 may be different, areas of the additional mask portions 3511 and 3312 may be different, and/or areas of the additional mask portions 3512 and 3311 may be different. In some embodiments, the photomask in FIG. 3 may also be applicable to forming the electrodes 132-133, the protrusion 1321-1331, the dummy electrodes 152-153, the dummy protrusions 1521-1531, the electrodes 141-143, the protrusions 1411-1431, the dummy electrodes 161-163, and the dummy protrusion 1611-1631, and the explanation therefore will not be repeated here.

Figures 4, 5, 6:
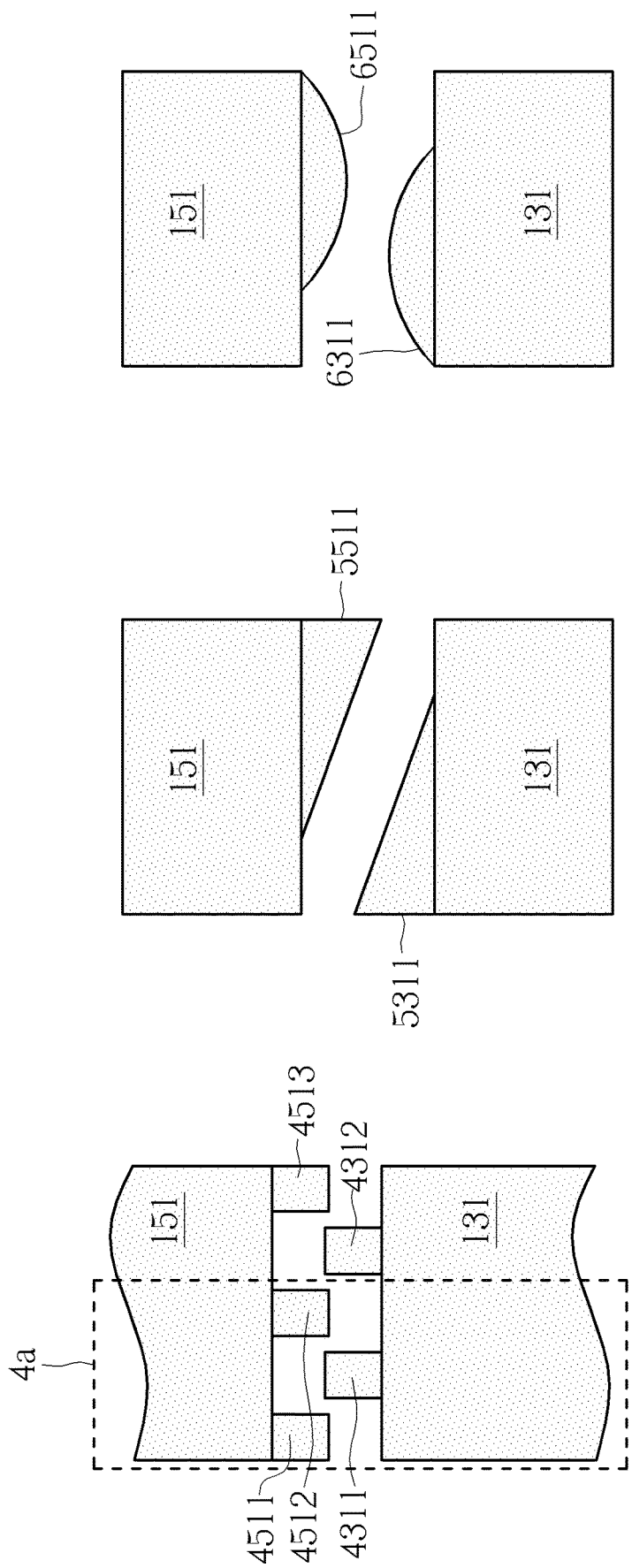
FIG. 4 is a schematic diagram of another transducer of the acoustic wave device in FIG. 1.
FIG. 5 is a schematic diagram of another transducer of the acoustic wave device in FIG. 1.
FIG. 6 is a schematic diagram of another transducer of the acoustic wave device in FIG. 1.

In some embodiments, the additional mask portions 3512 and 3311 may be removed from the photomask in FIG. 3. In other embodiments, the photomask may include additional mask portions of other shapes or may include more or less additional mask portions, so as to generate protrusion and dummy protrusions of different shapes, thereby reducing the distance between the electrodes 131 and the dummy electrodes 151. For example, at least one of the protrusion 1311 and the dummy protrusion 1511 may have a rectangular profile, a triangular profile, or an arc profile, as shown in FIGS. 4 to 6. In the embodiment, the protrusion and the corresponding dummy protrusion may have, but is not limited thereto, substantially identical shapes.

FIGS. 4 to 6 are schematic diagrams of other types of transducers of the SAW device 1. FIG. 4 shows that protrusions with rectangular profiles may be disposed at the end of the electrode and/or at the dummy end of the dummy electrode of the transducer 11 of the SAW device 1. Further, FIG. 4 shows the electrode 131, the protrusions 4311 and 4312, the dummy electrode 151, and the dummy protrusions 4511 to 4513. Each of the protrusions 4311 and 4312 is arranged alternately and sequentially with one of the dummy protrusions 4511 to 4513 along the direction D2. At least one of the protrusions 4311 and 4312 may be partially overlapped with one of the dummy protrusions 4511 to 4513 when viewed along the direction D1, although shown non-overlapped in FIG. 4. In some embodiments, the electrode and dummy electrode of the transducer 11 of the SAW device 1 may be configured as what shown in area 4a of FIG. 4.

FIG. 5 shows that protrusions with triangular profiles may be disposed at the end of the electrode and/or at the dummy end of the dummy electrode of the transducer 11 of the SAW device 1. Further, FIG. 5 shows the electrode 131, the protrusion 5311, the dummy electrode 151, and the dummy protrusion 5511. The protrusion 5311 may be arranged alternately and sequentially with the dummy protrusion 5511 along the direction D2. The protrusion 5311 may not be overlapped with the dummy protrusion 5511 when viewed along the direction D1, although shown partially overlapped in FIG. 5.

FIG. 6 shows that the protrusions with arc profiles may be disposed at the end of the electrode and/or the dummy end of the dummy electrode of the transducer 11 of the SAW device 1. Further, FIG. 6 shows the electrode 131, the protrusion 6311, the dummy electrode 151, and the dummy protrusion 6511. The protrusion 6311 may be arranged alternately and sequentially with the dummy protrusion 6511 along the direction D2. The protrusion 6311 may not be overlapped with the dummy protrusion 6511 when viewed along the direction D1, although shown partially overlapped in FIG. 6.

In various embodiments, the materials of the bus bars 121 and 122, the electrodes 131-133 and 141-143, and/or the dummy electrodes 151-153 and 161-163 of the transducer 11 may include metal, and the metal may include molybdenum (Mo), copper (Cu), aluminum (Al), gold (Au), platinum (Pt), tungsten (W) and any combination thereof.

Figure 7:
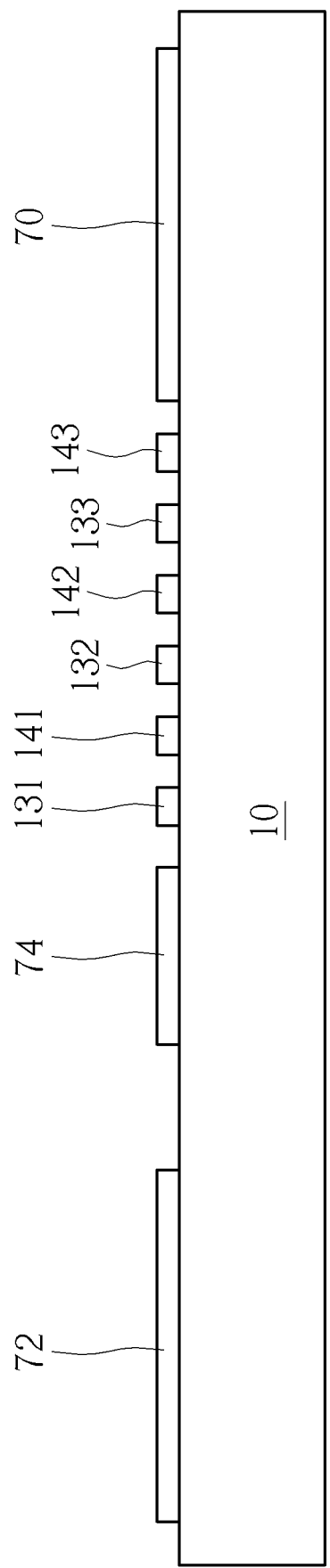
FIG. 7 and FIG. 8 show schematic diagrams of a method of fabricating the acoustic wave device in FIG. 1.
Figure 8:
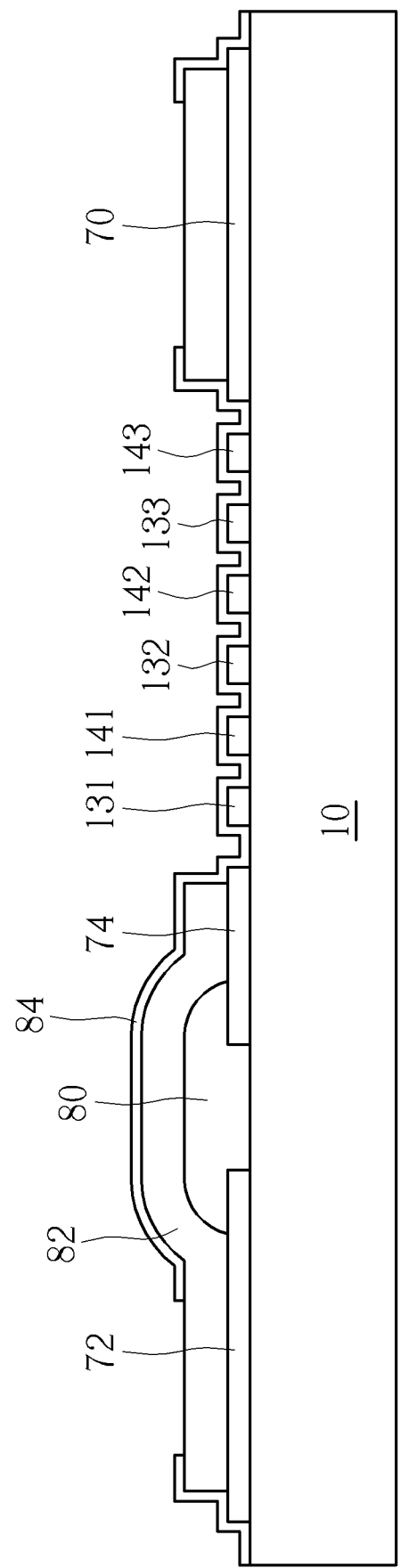
Figure 9:
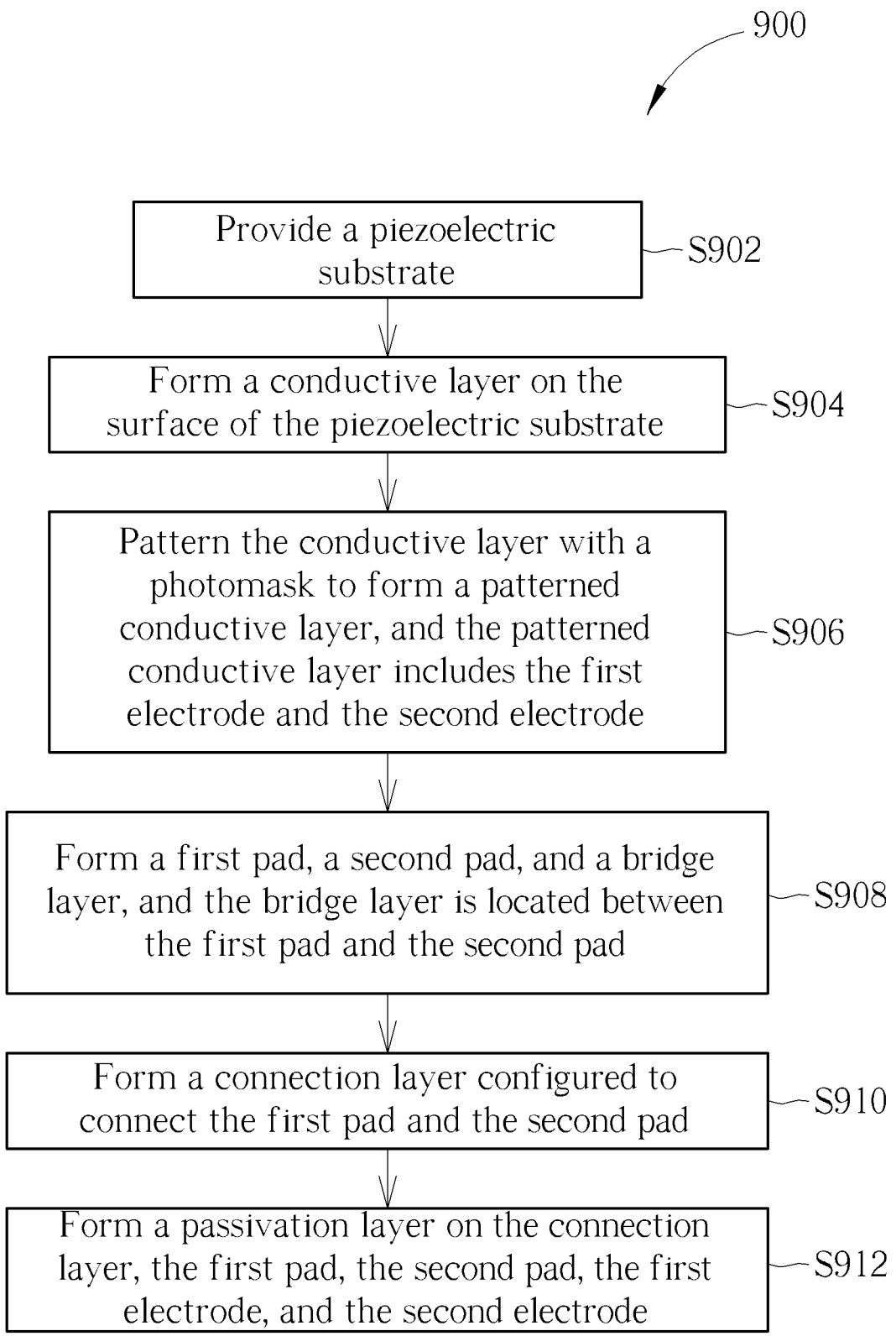
FIG. 9 is a flowchart of a method of fabricating the acoustic wave device in FIG. 1.

FIGS. 7 to 8 show schematic diagrams of a method of fabricating the SAW device 1. FIG. 7 shows the piezoelectric substrate 10, pads 70, 72, 74, and the electrodes 131 to 133, 141 to 143 of a transducer. The pads 70, 72, 74, and the electrodes 131 to 133, 141 to 143 of the transducer may form a patterned conductive layer. For example, the transducer may be the transducer 11 in FIG. 1. The pads 70, 72, and 74 may be coupled to external electrical connections. FIG. 8 further shows a bridge layer 80, a connection layer 82 and a passivation layer 84. FIG. 9 is a flowchart of the method 900 of fabricating the SAW device 1. The method 900 includes Steps S902 to S912 for fabricating the SAW device 1. Any reasonable step change or adjustment is within the scope of the present disclosure. Steps S902 to S912 are detailed as follows:

Step S902: Provide a piezoelectric substrate;

Step S904: Form a conductive layer on the surface of the piezoelectric substrate;

Step S906: Pattern the conductive layer with a photomask to form a patterned conductive layer, and the patterned conductive layer includes the first electrode and the second electrode;

Step S908: Form a first pad, a second pad, and a bridge layer, and the bridge layer is located between the first pad and the second pad;

Step S910: Form a connection layer configured to connect the first pad and the second pad;

Step S912: Form a passivation layer on the connection layer, the first pad, the second pad, the first electrode, and the second electrode.

Step S906 of the method 900 is exemplified with reference to FIGS. 7 and 8. In Step S906, the step of forming the patterned conductive layer includes forming the electrode 131 along the direction D1 and the electrode 131 having an end 131e, and forming the electrode 141 along the direction D1 and the electrode 141 having an end 141e. The electrode 131 and the electrode 141 are spaced apart along the direction D2. Further in Step S906, the step of forming the patterned conductive layer may further include forming at least one protrusion 1311 at the end 131e of the electrode 131, such that the protrusion 1311 extends along the direction D1 and partially obstructs the end 131e. Furthermore, in Step S906, the dummy electrode 151 is formed along the direction D1, aligned with the electrode 131 and has the dummy end 151e. The first gap is formed between the end 131e and the dummy end 151e. At least one dummy protrusion 1511 is formed at the dummy end 151e of the dummy electrode 151. The at least one dummy protrusion 1511 extends along the direction D1 and partially obstructs the dummy end 151e. The at least one protrusion 1311 and the at least one dummy protrusion 1511 are arranged at intervals along the direction D2.

In another embodiment, in Step S906, the photomask may include a pattern mask portion for forming electrodes and/or dummy electrodes and at least one additional mask portion. In Step S906, for example, the position of the at least one additional mask portion may correspond to the end 131*e* of the electrode 131 and/or the dummy end 151*e* the dummy electrode 151, so as to form a protrusion at the end 131*e* and/or a dummy protrusion at the dummy end 151*e*. In addition, at least one additional mask portion may also be used to modify the shapes of the end 131*e* of the electrodes 131 and/or the dummy end 151*e* of the dummy electrodes 151.

In some embodiments, the electrodes 131 to 133, the protrusions 1311 to 1331, the electrodes 141 to 143, and the protrusions 1411 to 1431 may be formed simultaneously using the photomask, and further, the dummy electrodes 151 to 153, the dummy protrusions 1511 to 1533, the dummy electrodes 161 to 163, and/or the dummy protrusion 1611 to 1631 may also be formed simultaneously. Referring to FIG. 8, after the patterned conductive layer is formed, the bridge layer 80 (S908), the connection layer 82 (S910) and the passivation layer 84 (S912) are sequentially formed.

The method 900 provides the protrusions and/or the dummy protrusions in a gap, reducing or eliminating energy leakage from the electrode to the dummy electrode, and/or energy leakage from the electrode to the bus bar, thereby enhancing the quality factor of the SAW device 1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An acoustic wave device comprising:
a piezoelectric substrate having a surface; and
a transducer disposed on the surface of the piezoelectric substrate, the transducer comprising:
 a first electrode extending along a first direction and having a first end;
 a second electrode extending along the first direction and having a second end, the second electrode and the first electrode being spaced apart along a second direction; and
 a plurality of first protrusions disposed at the first end of the first electrode, the plurality of first protrusions extending along the first direction and partially obstructing the first end.

2. The acoustic wave device of claim 1, wherein the transducer further comprises:
a first dummy electrode aligned with the first electrode along the first direction and having a first dummy end, wherein a first gap is formed between the first end and the first dummy end; and
at least one first dummy protrusion disposed at the first dummy end of the first dummy electrode, the at least one first dummy protrusion extending along the first direction and partially obstructing the first dummy end, wherein the plurality of first protrusions and the at least one first dummy protrusion are arranged at intervals along the second direction.

3. The acoustic wave device of claim 2, wherein:
the plurality of first protrusions and the at least one first dummy protrusion are arranged alternately and sequentially along the second direction.

4. The acoustic wave device of claim 1, wherein the transducer further comprises:
at least one second protrusion disposed at the second end of the second electrode, the at least one second protrusion extending along the first direction and partially obstructing the second end.

5. The acoustic wave device of claim 4, wherein the transducer further comprises:
a first dummy electrode aligned with the first electrode along the first direction and having a first dummy end, wherein a first gap is formed between the first end and the first dummy end;
at least one first dummy protrusion disposed at the first dummy end of the first dummy electrode, the at least one first dummy protrusion extending along the first direction and partially obstructing the first dummy end;
a second dummy electrode aligned with the second electrode along the first direction and having a second dummy end, wherein a second gap is formed between the second end and the second dummy end; and
at least one second dummy protrusion disposed at the second dummy end of the second dummy electrode, the at least one second dummy protrusion extending along the first direction and partially obstructing the second dummy end;
wherein the plurality of first protrusions and the at least one first dummy protrusion are arranged at intervals along the second direction, and the at least one second protrusion and the at least one second dummy protrusion are arranged at intervals along the second direction.

6. The acoustic wave device of claim 5, wherein:
the plurality of first protrusions and the at least one first dummy protrusion are arranged alternately and sequentially along the second direction; and
the at least one second protrusion and the at least one second dummy protrusion are arranged alternately and sequentially along the second direction.

7. The acoustic wave device of claim 5, wherein:
a distance between the plurality of first protrusions and the first dummy end in the first direction is at least 0.3 μm; and
a distance between the plurality of first protrusions and the at least one first dummy protrusion in the second direction is at least 0.3 μm.

8. The acoustic wave device of claim 5, wherein:
a distance between the at least one second protrusion and the second dummy end in the first direction is at least 0.3 μm; and
a distance between the at least one second protrusion and the at least one second dummy protrusion in the second direction is at least 0.3 μm.

9. The acoustic wave device of claim 5, wherein:
the first electrode and the plurality of first protrusions are formed integrally;
the second electrode and the at least one second protrusion are formed integrally;
the at least one first dummy protrusion and the first dummy electrode are formed integrally; or
the at least one second dummy protrusion and the second dummy electrode are formed integrally.

10. The acoustic wave device of claim 5, wherein:
a size of the plurality of first protrusions along the second direction is 5% to 50% of a size of the first electrode along the second direction;
a size of the at least one second protrusion along the second direction is 5% to 50% of a size of the second electrode along the second direction;
a size of the at least one first dummy protrusion along the second direction is 5% to 50% of a size of the first dummy electrode along the second direction; or a size of the at least one second dummy protrusion along the second direction is 5% to 50% of a size of the second dummy electrode along the second direction.

11. The acoustic wave device of claim 5, wherein at least one of the plurality of first protrusions, the at least one second protrusion, the at least one first dummy protrusion, the at least one second dummy protrusion has a rectangular profile, a triangular profile, or an arc profile.

12. The acoustic wave device of claim 4, wherein:
a size of the plurality of first protrusions along the second direction is 5% to 50% of a size of the first electrode along the second direction; and
a size of the at least one second protrusion along the second direction is 5% to 50% of a size of the second electrode along the second direction.

13. The acoustic wave device of claim 1, wherein the transducer further comprises:
a first bus bar extending along the second direction; and
a second bus bar extending along the second direction;
wherein the first electrode extends from the first bus bar to the first end along the first direction; and
the second electrode extends from the second bus bar to the second end along the first direction.

14. The acoustic wave device of claim 1, wherein the transducer further comprises:
at least another first electrode; and
at least another second electrode;
the first electrode, the at least another first electrode, the second electrode, and the at least another second electrode are arranged interdigitally along the second direction.

15. The acoustic wave device of claim 1, wherein the second direction is perpendicular to the first direction.

16. The acoustic wave device of claim 1, wherein a material of the first electrode and a material of the second electrode comprise metal, wherein the metal comprises molybdenum (Mo), copper (Cu), aluminum (Al), gold (Au), platinum (Pt), tungsten (W) and any combination thereof.

17. The acoustic wave device of claim 1, wherein:
a size of the plurality of first protrusions along the second direction is 5% to 50% of a size of the first electrode along the second direction.

18. A method of fabricating an acoustic wave device, the method comprising:
providing a piezoelectric substrate, the piezoelectric substrate having a surface; and
forming a transducer on the surface of the piezoelectric substrate, the transducer comprising:
a first electrode extending along a first direction and having a first end;
a second electrode extending along the first direction and having a second end, the second electrode and the first electrode being spaced apart along a second direction; and
a plurality of first protrusions disposed at the first end of the first electrode, the plurality of first protrusions extending along the first direction and partially obstructing the first end.

19. The method of claim 18, wherein:
the transducer is formed using a photomask, the photomask comprising:
a plurality of additional mask portions, wherein positions of the plurality of additional mask portions correspond to positions of the plurality of first protrusions of the first electrode; and
the method further comprises:
forming a first pad;
forming a second pad;
forming a bridge layer between the first pad and the second pad;
forming a connection layer on the first pad, the second pad and the bridge layer; and
forming a passivation layer on the connection layer, the first pad, the second pad, the first electrode, the second electrode, and the plurality of first protrusions.

20. The method of claim 18, wherein the transducer further comprises:
a first dummy electrode aligned with the first electrode along the first direction and having a first dummy end, wherein a first gap is formed between the first end and the first dummy end; and
at least one first dummy protrusion disposed at the first dummy end of the first dummy electrode, the at least one first dummy protrusion extending along the first direction and partially obstructing the first dummy end, wherein the plurality of first protrusions and the at least one first dummy protrusion are arranged at intervals along the second direction.

* * * * *